United States Patent
Nasum et al.

(10) Patent No.: US 10,957,655 B2
(45) Date of Patent: Mar. 23, 2021

(54) INTEGRATED CIRCUIT WITH INDUCTORS HAVING ELECTRICALLY SPLIT SCRIBE SEAL

(71) Applicant: Texas Instruments Incorporated, Dallas, TX (US)

(72) Inventors: Sreeram Subramanyam Nasum, Bangalore (IN); Kumar Anurag Shrivastava, Bangalore (IN); Jeffrey Alan West, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 40 days.

(21) Appl. No.: 16/291,042

(22) Filed: Mar. 4, 2019

(65) Prior Publication Data

US 2020/0185336 A1   Jun. 11, 2020

Related U.S. Application Data

(60) Provisional application No. 62/777,909, filed on Dec. 11, 2018.

(51) Int. Cl.
| | |
|---|---|
| *H01L 23/552* | (2006.01) |
| *H01L 23/544* | (2006.01) |
| *H01L 23/00* | (2006.01) |
| *H01L 27/01* | (2006.01) |
| *H01L 49/02* | (2006.01) |
| *H01L 21/70* | (2006.01) |

(52) U.S. Cl.
CPC .......... *H01L 23/552* (2013.01); *H01L 21/705* (2013.01); *H01L 23/544* (2013.01); *H01L 23/562* (2013.01); *H01L 23/564* (2013.01); *H01L 27/013* (2013.01); *H01L 28/10* (2013.01); *H01L 28/40* (2013.01); *H01L 2223/5446* (2013.01)

(58) Field of Classification Search
CPC combination set(s) only.
See application file for complete search history.

(56) References Cited

U.S. PATENT DOCUMENTS

| | | |
|---|---|---|
| 2009/0160029 A1 | 6/2009 | Pitts et al. |
| 2017/0025367 A1* | 1/2017 | Yang .................. H01L 25/0655 |
| 2018/0226920 A1 | 8/2018 | Mukherjee et al. |

* cited by examiner

*Primary Examiner* — Mounir S Amer
(74) *Attorney, Agent, or Firm* — Jacqueline J. Garner; Charles A. Brill; Frank D. Cimino (57) ABSTRACT

An IC includes a substrate including metal levels thereon including a top and bottom metal level with at least a transmit (Tx) circuit and receive (Rx) circuit each having ≥1 isolation capacitor and an inductor. A scribe seal around the IC includes a first portion around the Tx circuit and second portion around the Rx circuit, utilizing ≥2 of the metal levels including at least an outer metal stack. The Tx and Rx circuits are side-by-side along a direction that defines a length for the scribe seal. The outer metal stack includes a neck region between the scribe seal portions including a shorting structure including metal level(s) for shorting together the outer metal stack of the scribe seal portions. An optional routing pass-through isolated from the shorting structure includes other metal layers connecting through the neck region between node(s) within the first and second scribe seal portion.

16 Claims, 10 Drawing Sheets

INTEGRATED CIRCUIT WITH INDUCTORS HAVING ELECTRICALLY SPLIT SCRIBE SEAL

CROSS REFERENCE TO RELATED APPLICATIONS

This application claims the benefit of Provisional Application Ser. No. 62/777,909 entitled "NOVEL SCRIBE SEAL DESIGN TO ISOLATE ON-CHIP INDUCTORS", filed Dec. 11, 2018, which is herein incorporated by reference in its entirety.

FIELD

This Disclosure relates to semiconductor devices, more specifically to scribe seal arrangements for multi-channel digital isolator integrated circuits (ICs).

BACKGROUND

Some packaged semiconductor devices comprise a Multi-Chip Module (MCM) package which contains 2 or more IC die within the package. Electrical connections between the respective IC die when laterally positioned on die pads within a MCM generally include bond wires connecting to inner located bond pads on the different IC die including die-to-die bonds. One common MCM arrangement is a Small Outline Integrated Circuit (SOIC) package.

Some IC die have a circumscribing scribe seal located near the die edges, which serves to prevent cracks that are generated during die singulation (e.g., mechanical sawing) when in wafer form from propagating laterally through to the IC die that can otherwise reach and thus impair the functionality of the circuits (e.g., including transistors) of the IC die. Typical scribe seal designs comprise stacked electrically connected metal levels that can extend down to the metal 1 (M1) level which can be connected by a contact to the semiconductor surface for grounding.

Isolation of digital signals can be important in applications where common mode noise may be a problem, where high-speed data signal transmission may be subject to interference due to magnetic fields, and where the ground reference between two different devices (or systems) may not be compatible for a given application. For example, in motor control the motor side is generally at a very high voltage level as compared to the motor controller side. Digital isolators overcome many of the deficiencies of optical isolators, and are designed to galvanically isolate electronic systems.

One digital isolator arrangement comprises a first IC die and a second IC die generally including communication channels including a receiver on one IC die and a transmitter on the other IC die, where the respective IC die are coupled together by a bond wire, and at least one of the IC die includes at least one high voltage isolation (HV ISO) capacitor connected in the data channel path in series. This arrangement enables modulated data signals generated on the transmitter on one IC die to be passed to the receiver on the other IC die, but blocks high voltage (e.g., 500 or 1,000 volts) applied to the active circuitry on one IC die (e.g., the IC with the receiver IC) in its application from reaching the active circuitry on the other IC die (e.g., the IC die with the transmitter).

One type of MCM package comprises a multi-channel digital isolator that achieves low power operation by having an on-chip inductor-capacitor (LC) resonant circuit (generally called an LC tank) in the channel design in the transmit (Tx) and in the receive (Rx) circuitry. Each channel uses an on-chip inductor for both the Tx and the Rx circuitry to increase the passive gain through inductive tuning of the parasitic substrate capacitance of the HV ISO capacitors on each die. Passive gain enables a higher power efficiency reflected in a lower $I_q$, where Iq is the average current drawn from a power supply voltage, with the Iq value generally being expressed per cycle. One example multi-channel digital isolator device is the Texas Instruments' ISO7041 which is a 2 IC die 4-channel digital isolator MCM having 3 forward channels (3 Tx circuits) and 1 reverse channel (1 Rx circuit), where 1 IC die has 3 Tx circuits and 1 Rx circuit, and the other IC die has 3 Rx circuits and 1 Tx circuit, where the Tx and Rx circuits in each channel each have an associated LC tank.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC comprising a substrate including metal levels thereon including a top and bottom metal level with at least a first Tx circuit (e.g., having at least a modulator and a transmitter) and a first Rx circuit (e.g., having at least a receiver and a demodulator) having $\geq 1$ isolation capacitor and inductor. A scribe seal around the IC includes a first scribe seal portion around the Tx circuit and a second scribe seal portion around the Rx circuit, utilizing $\geq 2$ of the metal levels including at least one metal stack referred to herein as an outer metal stack. The Tx and Rx circuits are side-by-side along a direction that defines a length for the scribe seal. The outer metal stack includes at least one narrowed neck region between the scribe seal portions comprising a shorting structure including $\geq 1$ of the metal levels for shorting together the outer metal stack of the respective scribe seal portions. An optional routing pass-through electrically isolated from the shorting structure includes other(s) of the metal layers for connecting through the neck region between node(s) within the first and the second scribe seal portions.

BRIEF DESCRIPTION OF THE DRAWINGS

Reference will now be made to the accompanying drawings, which are not necessarily drawn to scale, wherein:

FIG. 3C shows only the M1 level of the outer metal stack in FIG. 3B shown including part of the routing pass-through.

FIG. 3E shows only the M3 level of the outer metal stack in FIG. 3B shown including part of the routing pass-through.

FIG. 3F shows only the M5 level of the outer metal stack in FIG. 3B shown including part of the routing pass-through.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Multi-channel digital isolators that have LC tanks for the Rx and Tx circuits on the IC die may face the problem of channel crosstalk due to inductive coupling both on the same IC die (e.g., a Tx circuit to a Rx circuit) and from die to die (the Tx circuit on the first IC die to an Rx circuit on the second IC die other than its intended Rx channel partner). In this arrangement the on-chip inductors of the LC tanks can couple together magnetically on the same die, and die to die, through various coupling paths including through the air, and/or through the die through stray loops including through the scribe seal, potentially leading to undesirable signal crosstalk between channels on the digital isolator that can reduce signal integrity. Besides magnetic coupling Tx to Rx, the magnetic coupling can also be Tx to Tx.

This Disclosure recognizes crosstalk across channels for multi-channel digital isolator ICs having LC tanks for the Rx circuits and Tx circuits needs to be minimized to preserve signal integrity, and the problem of crosstalk within the IC die is not sufficiently addressed by cutting along their length a portion of the metal stack(s) of the scribe seal to provide a scribe seal gap. This Disclosure instead addresses the problem of crosstalk in multi-channel digital isolator ICs having LC tanks for the Rx and Tx circuits by modifying the scribe seal design to provide a scribe seal that is electrically split by a disclosed shorting structure that utilizes at least one of the metals levels to split the scribe seal into at least 2 seal portions (or 2 loops), such as one scribe seal portion for the Tx circuit(s), and another scribe seal portion for the Rx circuit(s).

There is a narrowest 'neck' region between the respective scribe seal portions that has in the outer metal stack both a shorting structure across the neck region using some of the metal layer(s) of the metal stack and an optional pass-through structure using other(s) of the metal layers of the metal stack which connects common nodes within the semiconductor circuitry surrounded by the respective seal portions. The neck region generally has a width that is less than 25% of a maximum width of the scribe seal outside the neck region, typically being 2 to 25% of the maximum width. This arrangement solves the inductor cross-talk issue between inductors of different channels within the same scribe seal loop to better isolate the inductors from one another as evident in the Examples described below. A disclosed scribe seal arrangement including 2 or more scribe seal portions has been found to reduce within an IC die channel crosstalk by about 20 times as compared to a cut scribe-seal arrangement (see FIG. 5 in the Examples section described below) that thus essentially eliminates crosstalk between the inductors on a given IC die.

Figure 1:
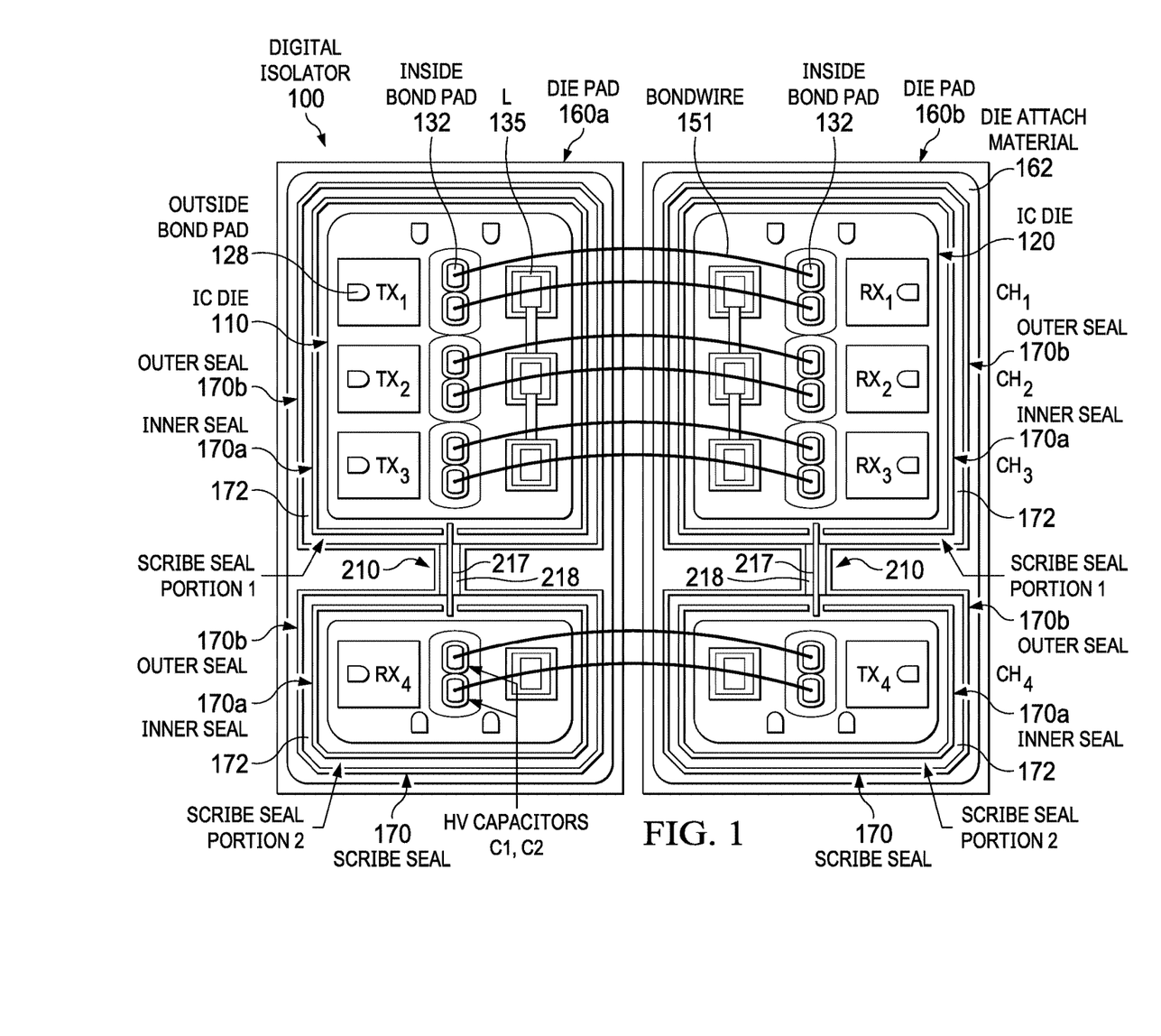
FIG. 1 is a top view depiction of an example 4 channel digital isolator MCM with each IC die including an LC tank in its Tx circuits and Rx circuits having a disclosed scribe seal that is electrically split into 2 scribe seal portions shown as a first scribe seal portion for the Tx circuit(s) and a second scribe seal portion for the Rx circuit(s).

FIG. 1 is a top view depiction of an example 4 channel digital isolator MCM 100 where each IC die 110, 120 includes LC networks for each of the Tx circuit(s) and Rx circuit(s), and the die each include a disclosed scribe seal 170 that is electrically split by a shorting structure 218 into 2 portions with one scribe seal portion for the Tx circuit(s) shown as scribe seal portion 1, and one scribe seal portion for the Rx circuit(s) shown as scribe seal portion 2. The scribe seal 170 has an inner metal stack 170a and an outer metal stack 170b that are separated by a separation gap 172 (also see this feature in FIG. 2C and FIG. 3A described below). As described below in FIG. 3A, the inner metal stack 170a and outer metal stack each 170b outside a disclosed neck region 210 both include a top metal level and bottom metal level coupled from the top metal level to the bottom metal level by vias, with the bottom metal level coupled by contacts to the semiconductor surface layer.

In the neck region 210 for both IC die 110, 120 there is a shorting structure 218 for shorting together scribe seal portion 1 and scribe seal portion 2 and there is also an optional routing pass-through 217 shown for coupling power and signal(s) between node(s) in scribe seal portion 1 and node(s) in scribe seal portion 2. The routing pass-through 217 is optional because there can be other arrangements for coupling power and signal(s) between node(s) in scribe seal portion 1 and node(s) in scribe seal portion 2, such as bondwires between pads within the two scribe seal portions instead of the pass-through routing 217.

The channels on IC die 110, 120 include at least one isolation capacitor that is generally a HV ISO capacitor shown as $C_1$, $C_2$ and an inductor 135 for each channel 1 to 4 ($CH_1$, $CH_2$, $CH_3$, $CH_4$) for both the transmit circuitry shown as Tx, and the receive circuitry shown as Rx. Having a first isolation capacitor and a second isolation capacitor enables differentiating signal and noise. The digital isolator 100 has forward and reverse channels, with $CH_1$, $CH_2$, and $CH_3$ being forward channels (those channels with Tx circuitry on IC die 110), and $CH_4$ being a reverse channel (having the Rx circuitry on IC die 110).

The inductors 135 in each channel are for compensation of parasitic capacitance of the isolation capacitors which can cause additional crosstalk between channels across a given IC die. There are outside bond pads 128 for bonding to leads of a leadframe package, and inside (interior) bond pads 132 for a bondwire 151 coupling the top plate of the isolation capacitors $C_1$, $C_2$ from one IC die to the top plate of the isolation capacitors $C_1$, $C_2$ on the other IC die. The IC die 110, 120 are shown on separate die pads 160a, 160b that typically are separated by >500 μm, where the IC die 110, 120 are secured to the die pad by die attach material 162, such as a metal filled epoxy. Each die pad 160a, 160b in a typical application is used for one voltage domain, where one side may be at a voltage near ground, and the other side may be at a HV up to about 400 to 1,500 Vrms.

Figure 2A:
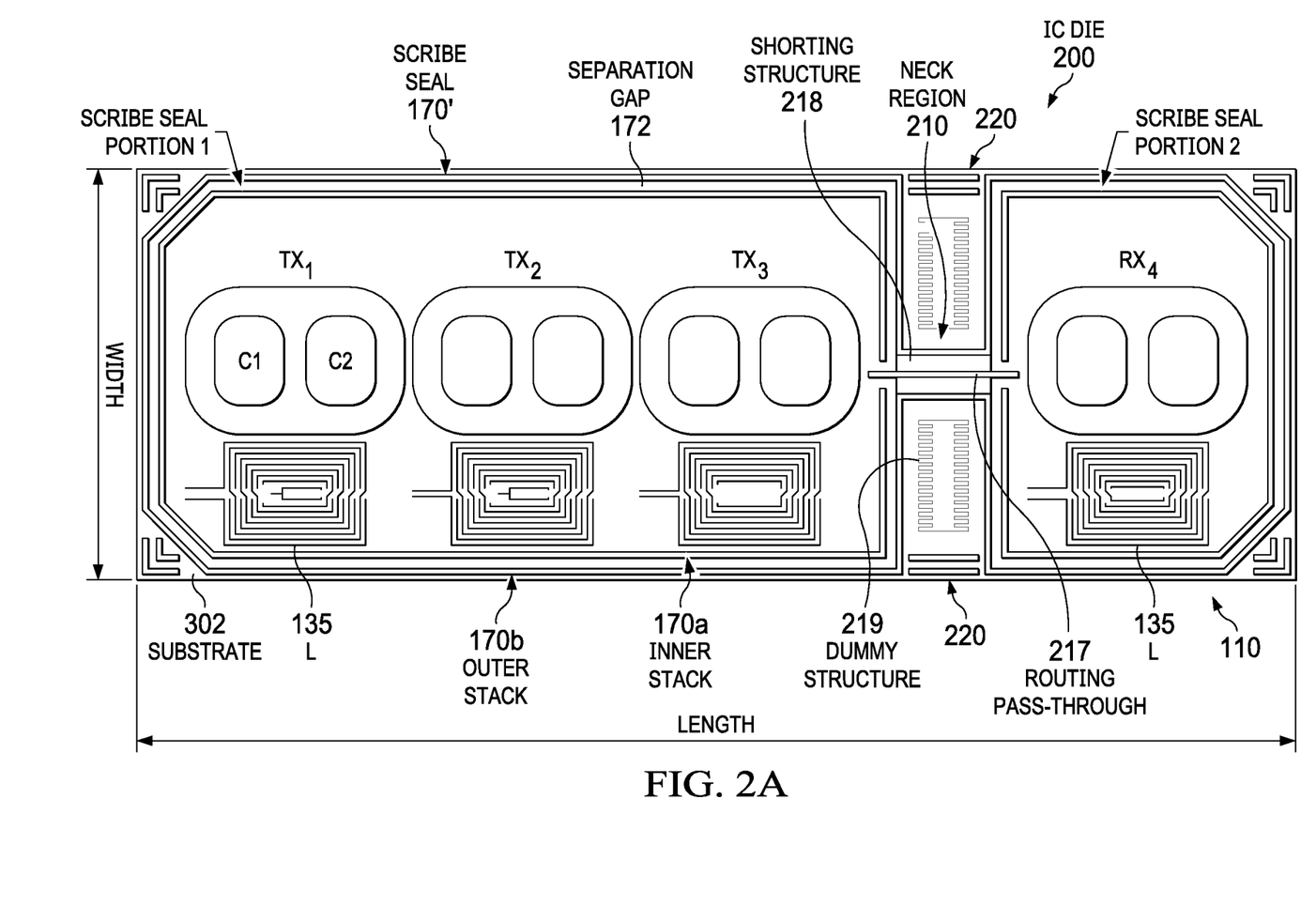
FIG. 2A is a top view depiction showing details for an example IC die including an LC tank having a disclosed scribe seal that is electrically split into 2 scribe seal portions, with one seal portion for the Tx circuits and one seal portion for the Rx circuit, that includes a narrowest neck region between the scribe seal portions that has both a shorting structure (using some of the metal layer(s) of the metal stack) and a pass-through structure (using others of the metal layer(s) of the metal stack). This arrangement solves the inductor cross-talk issue between inductors of different channels within the same scribe seal loop

FIG. 2A is a top view depiction showing details for an example die shown as IC die 200 supporting 4 channels having a disclosed electrically split scribe seal 170' including an inner metal stack 170a and an outer metal stack 170b separated by separation gap 172 that is electrically split by a shorting structure 218 into 2 portions with one scribe seal portion shown as portion 1 for the Tx circuit(s), and one scribe seal portion shown as scribe seal portion 2 for the Rx circuit(s). Disclosed electrically split scribe seals preserve the requirements of scribe seal for manufacturability, namely to prevent circuit failure by suppressing impinging cracks generated during subsequent mechanical or laser dicing of the wafer to achieve die singulation, and to provide an ion barrier to prevent ingress of mobile ions from external sources from laterally diffusing into the IC die's semiconductor through exposed dielectrics at the die edge that otherwise can degrade the performance of transistors and potentially cause shifts in circuit performance.

Instead of circumscribing the entire IC die as is conventional for scribe seals, the scribe seal 170' for IC die 200 jogs away from the top and bottom edges of the IC die toward the die's interior region to create a neck region 210 that has its outer metal stack 170b shorted by a shorting structure 218 which provides electrical splitting into the scribe seal portions that forces loop current in the scribe seal 170' to flow locally across the neck region 210 thus avoiding a bigger common loop in this arrangement between the Tx circuits and the Rx circuit on the IC die 200. The shorting structure 218 extends from one side of the outer metal stack 170b of the scribe seal 170' to another side of the outer metal stack 170b of the scribe seal, wherein the shorting structure 218 divides the scribe seal 170' into a Tx scribe seal portion circumscribing the Tx circuit but not the Rx circuit shown as scribe seal portion 1 and a Rx scribe seal portion circumscribing the Rx circuit but not the TX circuit shown as scribe seal portion 2. All common stray loops (closed electrical conductor structures acting as parasitic inductors) are self-contained by the electrical splitting provided by the shorting structure 218 in the neck region 210 of the scribe seal 170'. Crosstalk between inductors within the IC die 200 due to the scribe seal loop and all other common loops are almost completely eliminated.

Dummy structures 219 are shown above and below at the neck region 210 that are included for added manufacturability. The dummy structures 219 generally comprise all of the metal levels and are added to provide uniform pattern density for better etch and chemical mechanical polishing (CMP) during fabrication of the semiconductor die. The isolated dummy seal structures along the top and bottom edges of the IC die 200 between the scribe seal portions 1 and 2 bounding the dummy structures 219 minimize the number of wafer dicing-induced IC die cracks that can reach the neck region 210.

In the neck region 210 besides the shorting structure 218 there is as described above an optional routing pass-through 217. The routing pass-through 217 utilizes one or more of the metals layers of the outer metal stacks 170b other than those used for the shorting structure 218 for coupling power and signal(s) between node(s) in scribe seal portion 1 and node(s) in scribe seal portion 2. Common signals between the Tx and Rx channels on the IC die 200 (such as DC power, or signal(s)) are thus passed through some metal levels with some series resistance which provides more isolation between the Tx circuity and Rx circuitry. Some metal levels for the outer metal stack 170b are passed through the neck region 210 between the Tx side and the Rx side by the routing pass-through 217, so that the shorting structure 218 does not short all the metal levels between the seal portions. (See FIGS. 3B-3F described below).

Conventional scribe seals include all the levels of metal on the IC die coupled by vias through inter-level dielectric (ILD) to form a solid vertical wall, but for disclosed aspects the neck region 210 for the outer metal stack 170b has less than all (e.g., 3 of the 5) of the metal levels on the IC die, thus a subset of the metal levels. For example MET 1, 3, and 5 can be used to provide scribe seal shorting for the shorting structure 218 in the neck region 210, where MET2 and MET4 can pass power or signals horizontally through this region shown as a routing pass-through 217. These particular metal levels are used only as an example. However, a disclosed aspects is that for the outer metal stack 170b in the neck region 210, some metal levels are used to short the scribe seal's top metal and bottom metal edges together, while other(s) metal levels are used to just pass signals/voltages through this neck region 210 to and from the Tx region within scribe seal portion 1 and the Rx region within scribe seal portion 2.

Figure 2B:
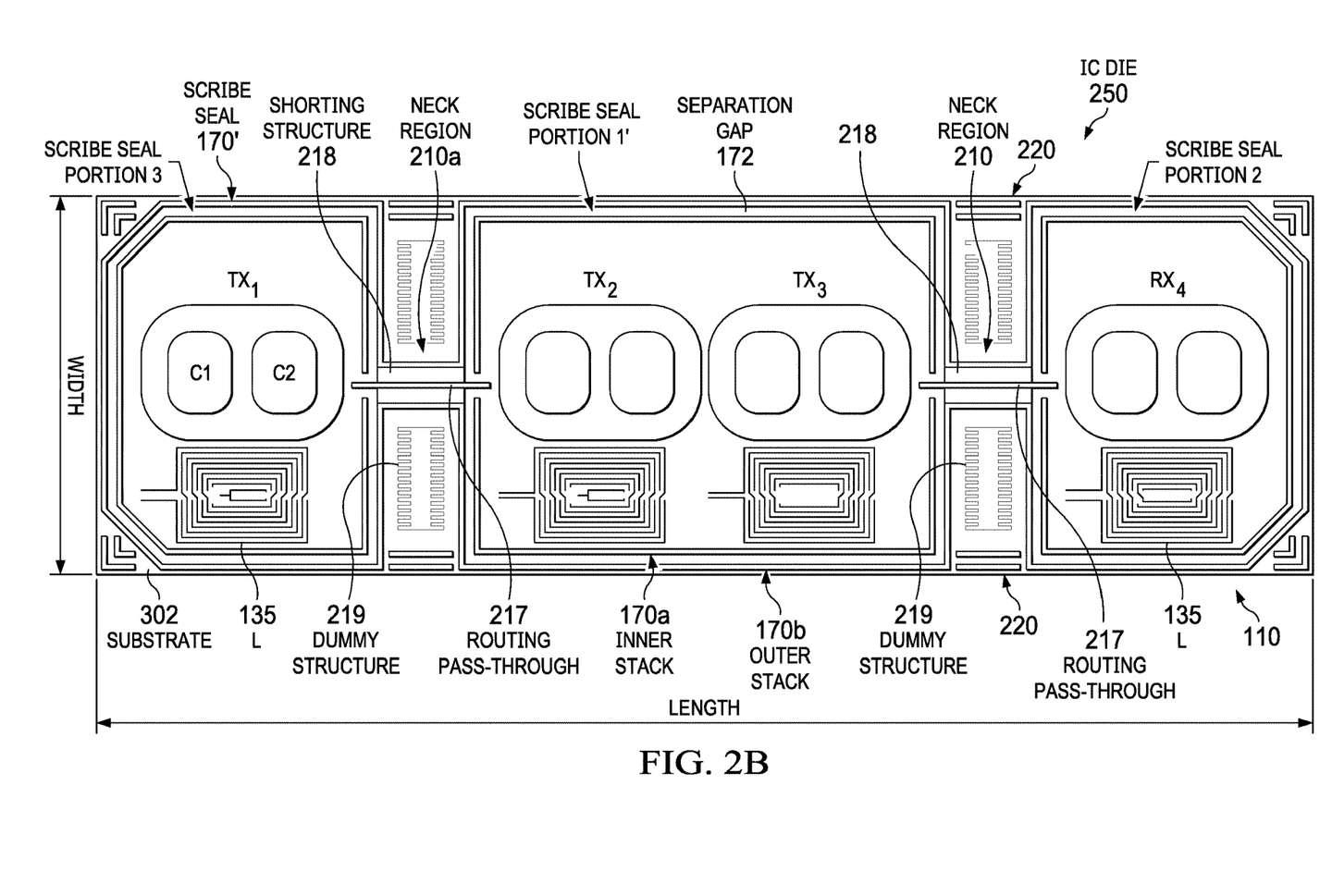
FIG. 2B is a top view depiction showing details for an example IC die that comprises the IC die shown in FIG. 2A where the scribe seal portion for the Tx circuits shown in FIG. 2A is further electrically split into two Tx scribe seal portions that has a neck region between including a shorting structure and a pass-through structure.

FIG. 2B is a top view depiction showing details for an IC die shown as 250 configured for a 4 channel digital isolator that comprises the IC die shown in FIG. 2A where the Tx circuit scribe seal portion shown as scribe seal portion 1 in FIG. 2A is further electrically split into first Tx scribe seal portion shown as scribe seal portion 3 and a second Tx scribe seal portion shown as scribe seal portion 1' that has a neck region 210a in between including a shorting structure 218 and a routing pass-through 217. This FIG. shows there can be 3 or more separated scribe seal portions on an IC, thus not being limited to only the 2 scribe seal portions as shown in FIG. 2A.

Figure 2C:
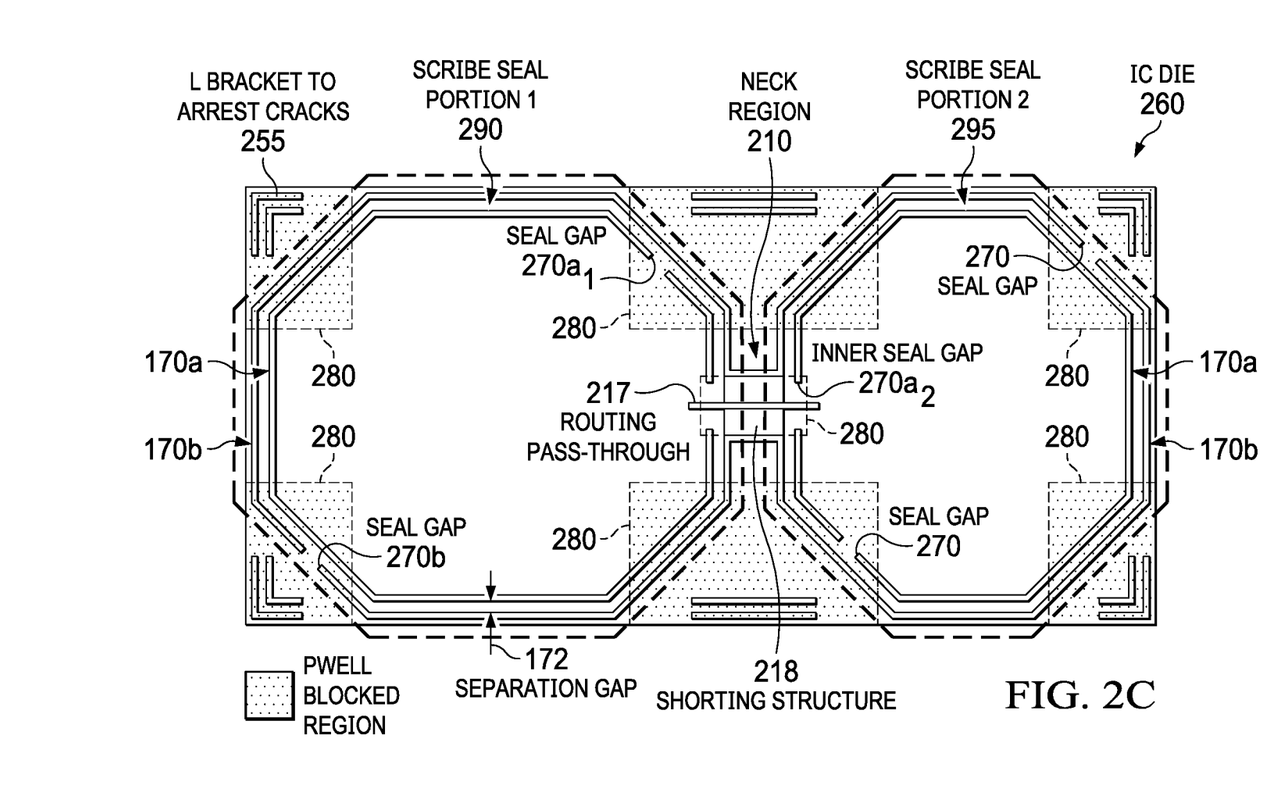
FIG. 2C is a simplified top view depiction that shows an IC die with a scribe seal including an outer metal stack and an optional inner metal stack, each having a seal gap in both the first scribe seal portion and the second scribe seal portion, shown including optional well implant blocked regions that increase the substrate resistance in the vicinity of the seal gaps to minimize current flow across the gap through the substrate that can contribute to channel crosstalk. L-brackets are included to arrest cracks that might otherwise pass through a gap in the outer metal stack and are shown at all four corners of the IC die.

FIG. 2C is a simplified top view depiction that shows an example IC die 260 with an electrically split scribe seal including an inner metal stack 170a and an outer metal stack 170b, separated by a separation gap 172, with the inner metal stack 170a having an inner seal gap $270a_1$ and inner seal gap $270a_2$ in the neck region 210 and an outer metal stack 170b each having an outer seal gap 270b, respectively, in both the first seal portion 290 and the second seal portion 295. The separation gap 172 may be about 12 to 16 μms wide, although this dimensions may vary according to the application. The seal gaps $270a_1$ and 270b may be on the order of the size as the separation gap 172, or on the order of about 20 μm. FIG. 2C also shows optional implant blocked regions 280 that reduce the substrate doping level in seal gap regions $270a_1$ and 270b, thereby increasing the substrate resistance in the seal gap regions to reduce current flow that can bridge the seal gap and contribute to channel crosstalk. L brackets 255 are also shown that arrest cracks at the IC die corners.

Figure 3A:
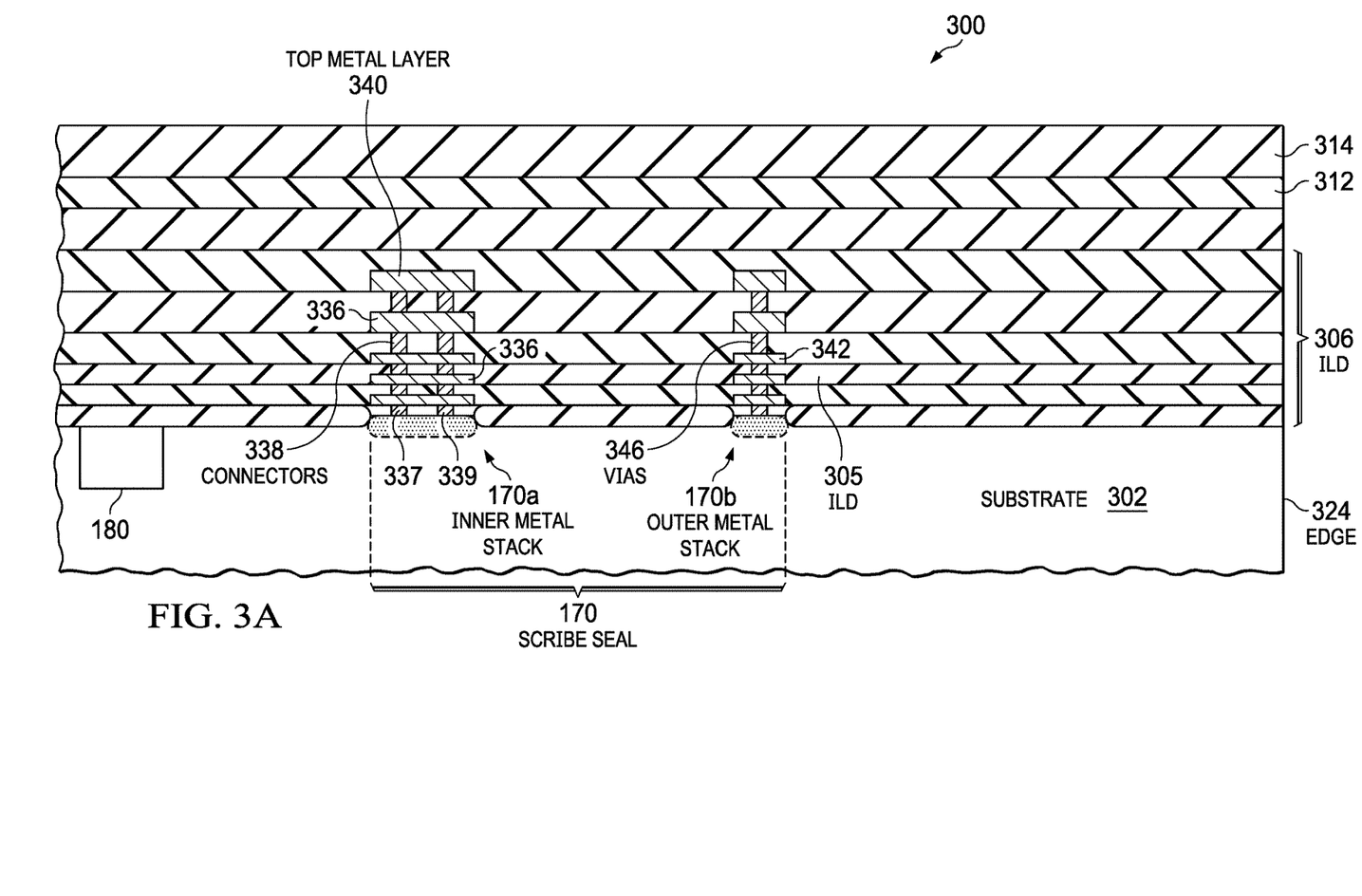
FIG. 3A is a side cut-away exploded view of a portion of the IC die shown in FIG. 2A showing the respective metal levels of an example scribe seal outside of the neck region or seal gaps showing the metal stacks for inner metal stack and for the outer metal stack.

FIG. 3A is a detailed cut-away view of a portion of a digital isolator IC 300 away from the neck region or seal gaps showing the scribe seal 170 including an inner metal stack 170a and an outer metal stack 170b. The scribe seal for the other IC die for the digital isolator MCM is identical or substantially similar to the scribe seal 170 described below. The IC 300 includes a substrate 302 having a plurality of layers formed thereon. There is functional circuitry 180 shown as a block which represents circuit elements (including transistors, and generally diodes, resistors, capacitors, etc.) formed in the substrate 302 and overlying layers configured to provide Tx circuit(s) including modulator and a transmitter, Rx circuit(s) including a receiver and a demodulator, isolation capacitors and Ls, that are configured for a digital isolator function. The same layers used to make the circuitry, isolation capacitors, transistors, and diodes for the functional circuitry 180 are also used to make the scribe seal 170, which thus does not require any unique layers that are not already available for building the circuits and components already on the IC 300.

Layer 305 is an example of one of the plurality of ILD layers 306, such as a plurality of silicon dioxide ($SiO_2$) layers. There are connectors 338 (e.g., vias) through the ILD layers for connecting the adjacent metal layers. Layer 312 is a protective overcoat that may be a silicon oxide layer. In some examples, the layer 312 is referred to as a passivation oxide. A layer 314 is also a protective overcoat, such as silicon oxynitride (SiON) or silicon nitride (SiN). In some examples, the layer 314 is a material that has high electrical insulating properties, which are greater than the insulting properties of a mold compound (not shown) that encapsulates the IC 300. In other examples, the layer 312 and the layer 314 are combined into a single layer that has high insulating properties, such as higher insulating properties than the above-described mold compound. For example, the mold compound may have a dielectric breakdown strength of approximately 120V/μm, so the layers 312 and/or 314 may have higher dielectric breakdown strengths than 120V/μm.

As described above, the scribe seal 170 serves to prevent cracks from propagating through the layers on the IC die 300, such as during wafer singulation. During the sawing process in singulation, cracks can form at the edge 324 of the IC die 300 and propagate laterally toward the scribe seal 170. The scribe seal 170 serves to arrest the propagation of such cracks.

As noted above, the scribe seal 170 includes an inner metal stack 170a and an outer metal stack 170b. Two metal stacks are included because there is a seal gap somewhere in the scribe seal such as shown as $270a_1$ and 270b in FIG. 2C as described above, typically at the corner of the IC die, to electrically "open" the scribe seal loop which minimizes the inductor driven channel crosstalk on the IC die. The seal gap in the scribe seal however becomes a mechanically weak point where cracks (such as due to die singulation/sawing) can reach into the IC die interior or ionic contamination can diffuse into the semiconductor of the IC die and impact the performance of transistors. So there is also an outer metal stack 170b that itself has a seal gap, but this seal gap is generally on the diagonally opposite side of the IC die so that if a crack gets through the seal gap in the outer metal stack 170b, it will be arrested by the inner metal stack 170a.

Also to inhibit ionic contamination the seal gaps in the inner metal stack 170a and in the outer metal stack 170b are generally placed as far from each other as possible so that the probability of an ion diffusing into the gap from outer metal stack 170b then navigating all the way to the other side of the die through the seal gap in the inner metal stack 170a is vanishingly small because the grounded inner and outer metal stacks 170a, 170b will attract the charged ions, rendering them immobile. The layers 312 and/or 314 provide additional isolation to reduce the effects of HV potentials between overhead bond wires and the inner and outer metal stacks 170a and 170b.

The inner metal stack 170a includes a plurality of metal layers 336 that are located in some or all of the layers. In the example of FIG. 3A, the metal layers 336 are located in the ILD layers 306, which as shown by example has 5 layers. Connectors 338 are shown configured as vias, which may be small openings or die-circumscribing trenches, electrically connecting the metal layers 336 to each other.

The inner metal stack 170a contains conductors for the connectors 338 that are shown in two groups, an interior group 337 and an exterior group 339. The interior group 337 and exterior group 339 may be long trenches that fully circumscribe the IC die 300. The interior group 337 forms a solid wall of metal that prevents entry of moisture, contamination, and cracks.

The outer metal stack 170b includes a plurality of metal layers 342. The metal layers 342 are located in layers including the ILD layers 306, so the number of metal layers 342 is generally equal to the number of metal layers 336 in the inner metal stack 170a. The metal layers 342 are electrically connected to each other by way of a plurality of conductors 346, which also connect the metal layers 342 to a potential, such as ground. In some examples, the conductors 346 are vias and in other examples the conductors 346 are trenches that circumscribe the IC die 300. The metal layers 342 may be electrically connected to the same potential, such as to a ground node, as the metal layers 336. The outer metal stack 170b has a top metal level 340 that has a top surface. The top metal level 340 is the metal level in the outer metal stack 170b that is after bond wiring is closest to the bond wire.

Figure 3B:
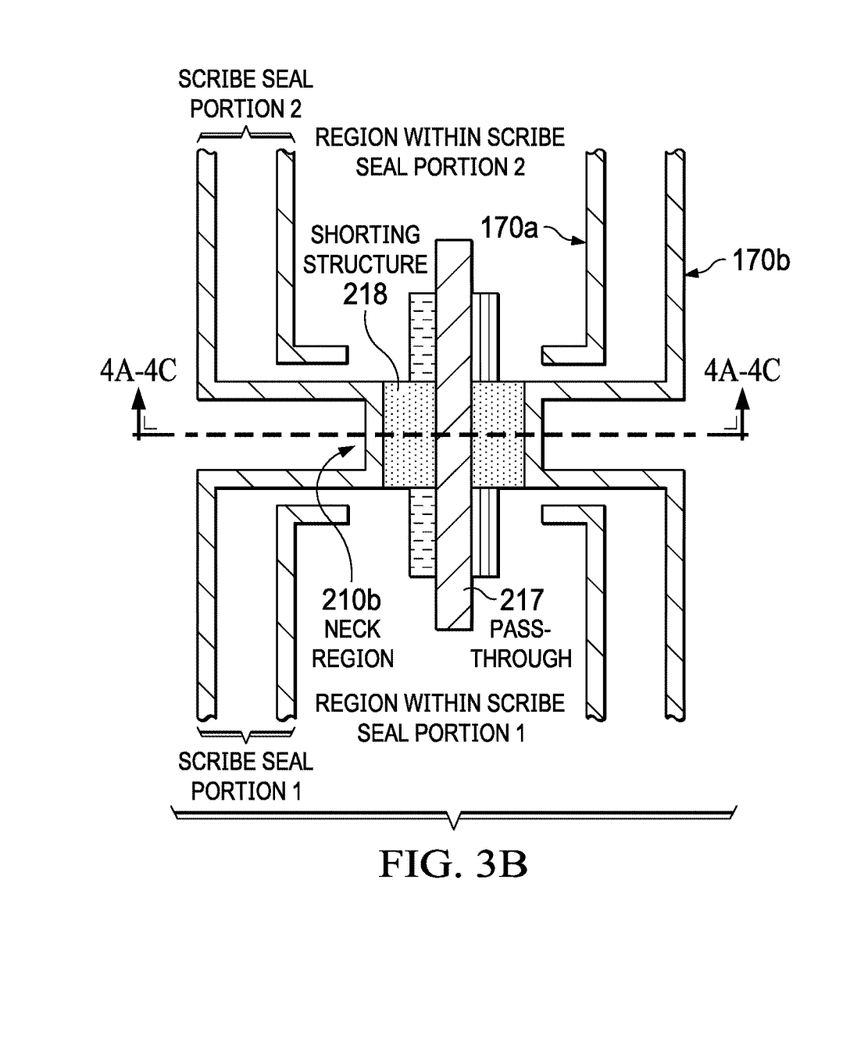
FIG. 3B depicts an example scribe seal routing showing the inner metal stack and the outer metal stack showing for the outer metal stack inside the neck region where the odd metal levels that are MET 1, MET 3, and MET 5 for a 5 metal level device constitute the metal levels for the routing pass-through through the neck region, and wherein the even metal levels MET2, and MET 4 constitute the shorting structure used to short across the neck region. A cutline is shown including across the full width dimension of the neck region which is the basis of FIGS. 4A-4C.

FIG. 3B depicts an example scribe seal routing in the neck region shown as 210b where the odd metal levels that are MET 1, MET 3, and MET 5 for an example 5 metal level stack are the metal levels for the routing pass-through 217 through the neck region 210b, and the even metal levels MET 2 and MET 4 are the metal levels for the shorting structure 218 used to short the scribe seal portions across the neck region 201b. MET 1, MET 2, MET 3, MET 4 and MET 5 are not explicitly shown in FIG. 3B. As shown in FIGS. 3C-3F described below the metal levels of the shorting structure 218 shown as MET 2, MET 4 in FIG. 3D do not short the metal levels of the routing pass-through 217 shown as MET 1, MET 3, and MET 5 in FIGS. 3C, 3E and 3F respectively, because the metal lines for the routing pass-through 217 are fed through a seal gap (see $270a_2$ in FIG. 2C) at these levels in the inner metal stack 170a on both sides of the neck region 210. A cutline is also shown including across the full width dimension of the neck region 210b which is the basis of FIGS. 4A-4C cross-sectional diagrams that are described below.

Figure 3C:
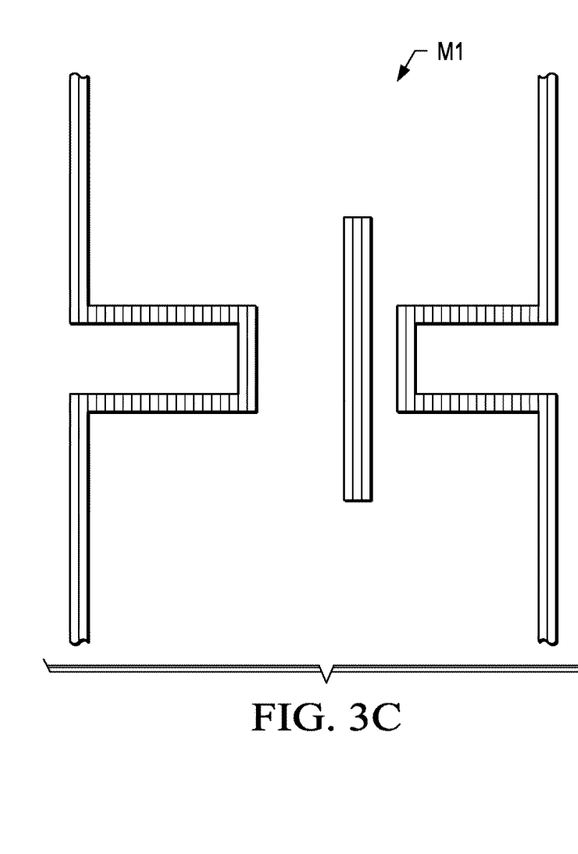
Figure 3D:
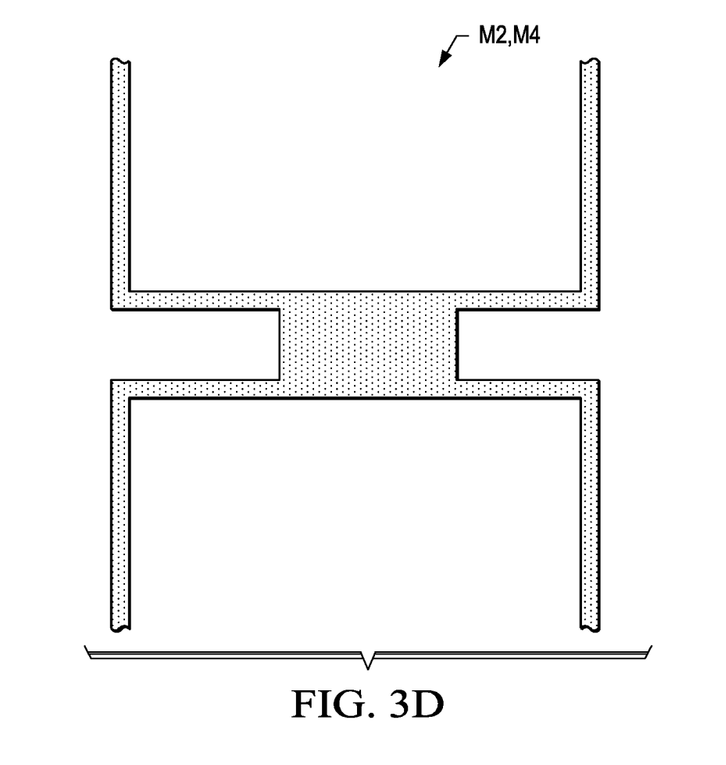
FIG. 3D shows only the M2 and M4 level of the outer metal stack in FIG. 3B providing the shorting structure.
Figure 3E:
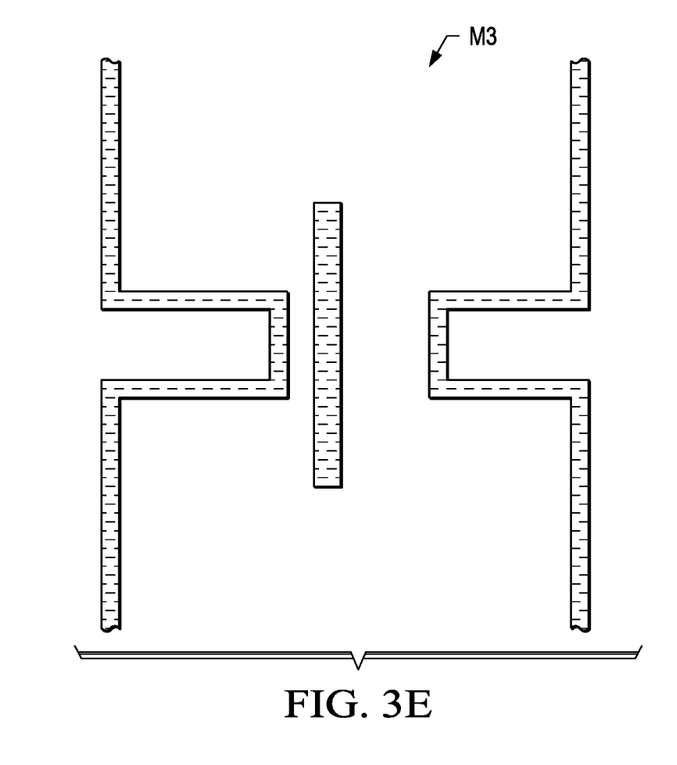
Figure 3F:
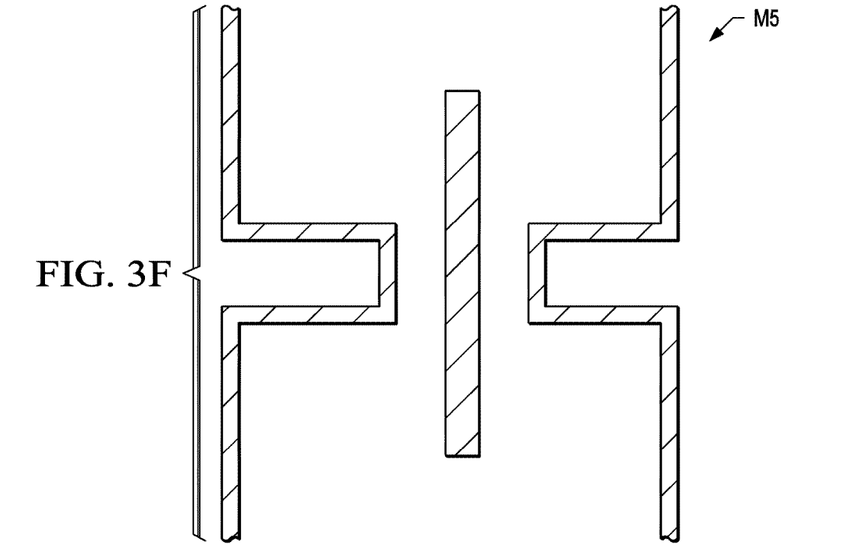

FIG. 3C shows only the M1 level of the outer metal stack in FIG. 3B shown including part of the routing pass-through. FIG. 3D shows only the M2 and M4 levels of the outer metal stack in FIG. 3B providing the shorting structure. FIG. 3E shows only the M3 level of the outer metal stack in FIG. 3B shown including part of the routing pass-through. FIG. 3F shows only the M5 level of the outer metal stack in FIG. 3B shown including part of the routing pass-through.

Figure 4A:
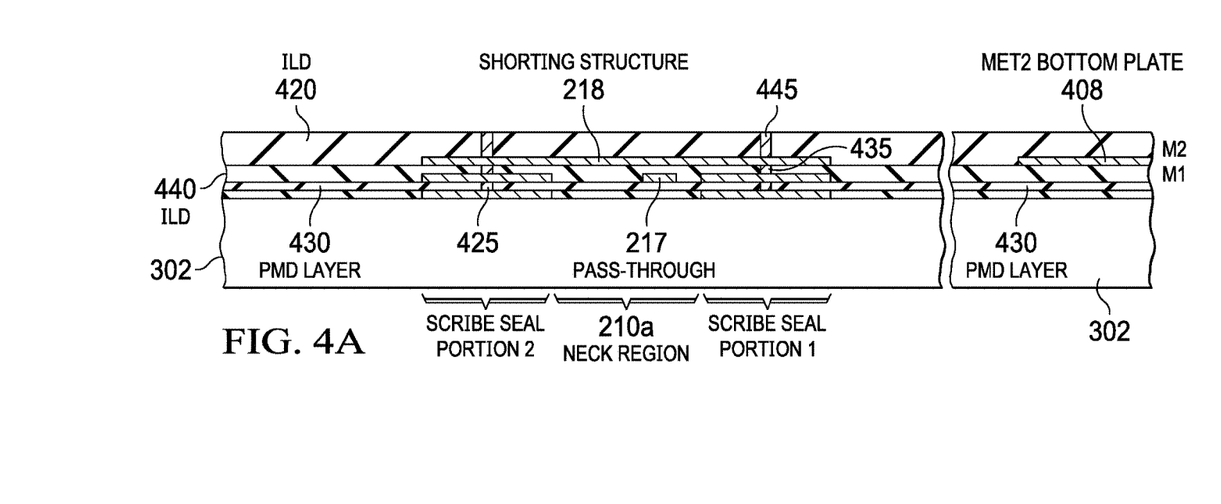
FIGS. 4A-4C are cross-sectional diagrams showing processing progression for an example method of forming a digital isolator IC including a disclosed electrically split scribe seal split into 2 scribe seal portions with one scribe seal portion for the Tx circuit(s), and one scribe seal portion for the Rx circuit(s), with the shorting structure shorting across the width dimension of the neck region, according to an example aspect.
Figure 4B:
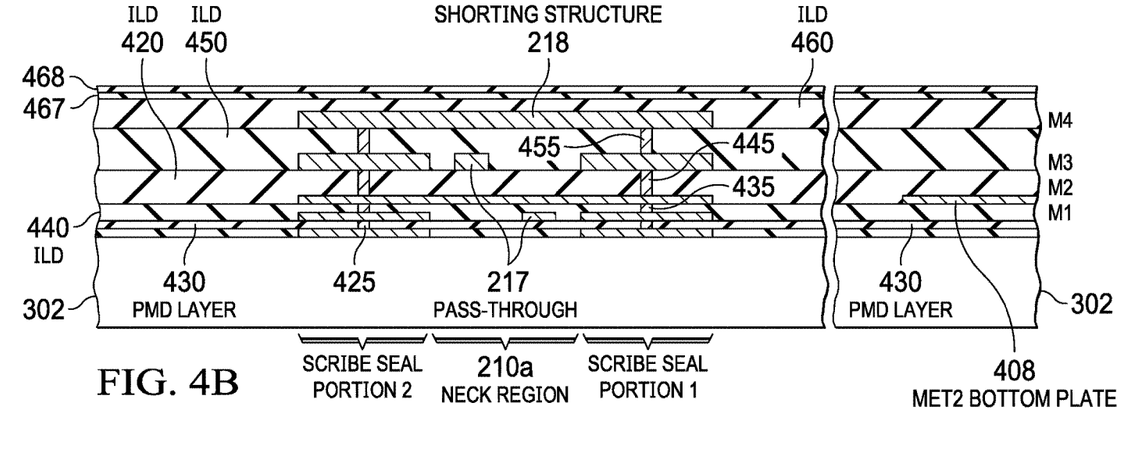
Figure 4C:
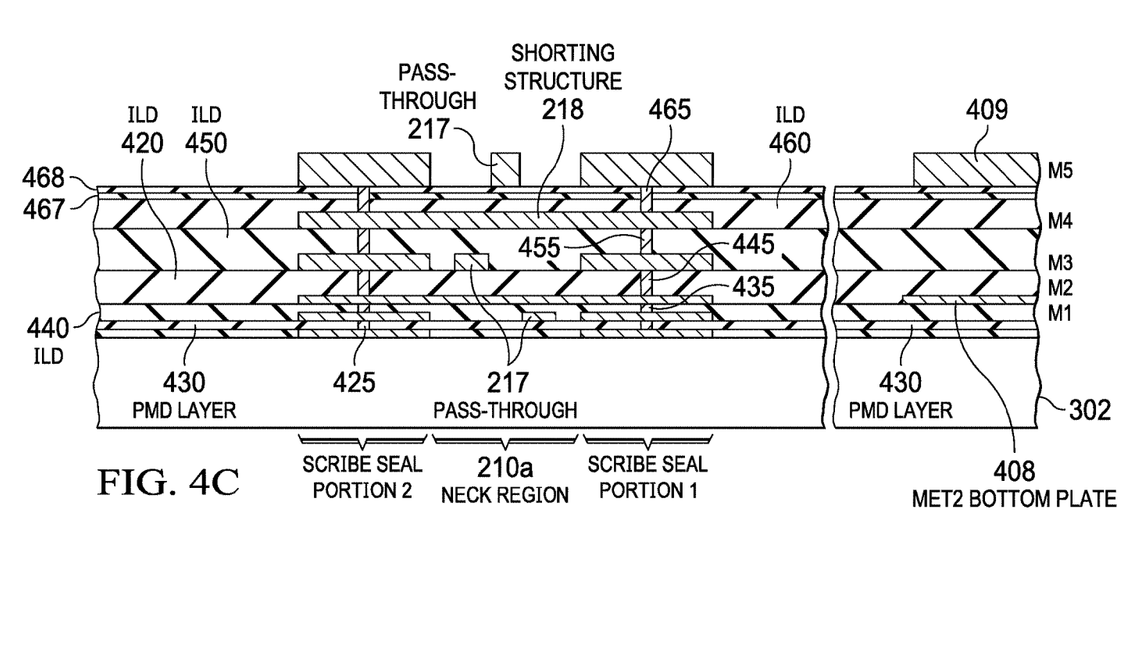

FIGS. 4A-4C are cross-sectional diagrams showing processing progression for an example method of forming a digital isolator IC on a substrate 302 including an LC network (or LC tank) having a disclosed scribe seal electrically split into at least 2 portions with one scribe seal portion for the Tx circuit(s), and one scribe seal portion for the Rx circuit(s), according to an example aspect. FIGS. 4A-4C show the two outer scribe seal portions 1 and 2 being shorted by the shorting structure 218 in the width dimension as well as the optional pass through structure 217. FIG. 4A shows a cross-sectional diagram for the in-process IC after M2 formation that includes forming a bottom plate 408 for an isolation capacitor, followed by forming an ILD layer 420 with vias 445 through it. There are contacts 425 through a pre-metal dielectric (PMD) layer 430 from M1 to a diffusion in the substrate 302, and vias 435 through an ILD layer 440 between M1 and M2. There is also shown M2 bottom plate 408 of the isolation capacitor. Besides the shorting structure 218 there is also shown an optional routing pass through 217 that at this point only has M1.

At this stage of the process, the in-process shorting structure 218 only includes a M2 layer. The in-process shorting structure shown at this point as M2 provides shorting of a portion of the metal stack (the outer metal stack if both an inner and an outer metal stack) for shorting together scribe seal portion 1 and scribe seal portion 2. M2 at this point is providing the shorting structure across the width dimension of the neck region 210a. There is also a squiggle line shown running vertically in FIGS. 4A-C between scribe seal portion 1 and the M2 bottom metal plate 408, because there may be a grounded faraday cage structure that can surround each HV capacitor (which may be a HV capacitor pair) and there may generally also be some miscellaneous shielding and other circuitry in this region, so that the squiggles indicate other features not shown that may be there.

FIG. 4B shows a cross-sectional diagram for the in-process IC after M3 and M4 formation. The in-metal stacks in the scribe seal portions 1 and 2 are also shown now spanning M1 to M4 with vias 455 through ILD 450 between M3 and M4, with ILD 460 over M4. On top of the ILD 460 is a top dielectric layer 468 such as a SiN layer over a lower dielectric layer 467 such as a SiON layer that when used under the top plate of the capacitor (see 409 in FIG. 4C described below) can enhance the HV performance of the device. The shorting structure 218 now has a M4 level over a M2 level for shorting together of a portion of the metal stack in scribe seal portion 1 to the metal stack in scribe seal portion 2. Besides the shorting structure 218 there is also shown the optional routing pass through 217 that at this point has M1 and M3.

FIG. 4C shows a cross-sectional diagram for the in-process IC after M5 formation which is the top metal in this example which also provides a top plate for the isolation capacitor. The in-process metal stacks are also shown now spanning M1 to M5, with M1 grounded to a diffusion in the substrate 302. FIG. 4C also shows the in-process shorting structure 218 across the width of the neck portion 210a that comprises M2 and M4 for shorting a portion of the metal stacks in scribe seal portion 1 and scribe seal portion 2. Besides the shorting structure 218 there is also shown the optional routing pass through 217 that at this point that uses M5, M3 and M1.

Examples

Disclosed aspects are further illustrated by the following specific Examples, which should not be construed as limiting the scope or content of this Disclosure in any way.

Figure 5:
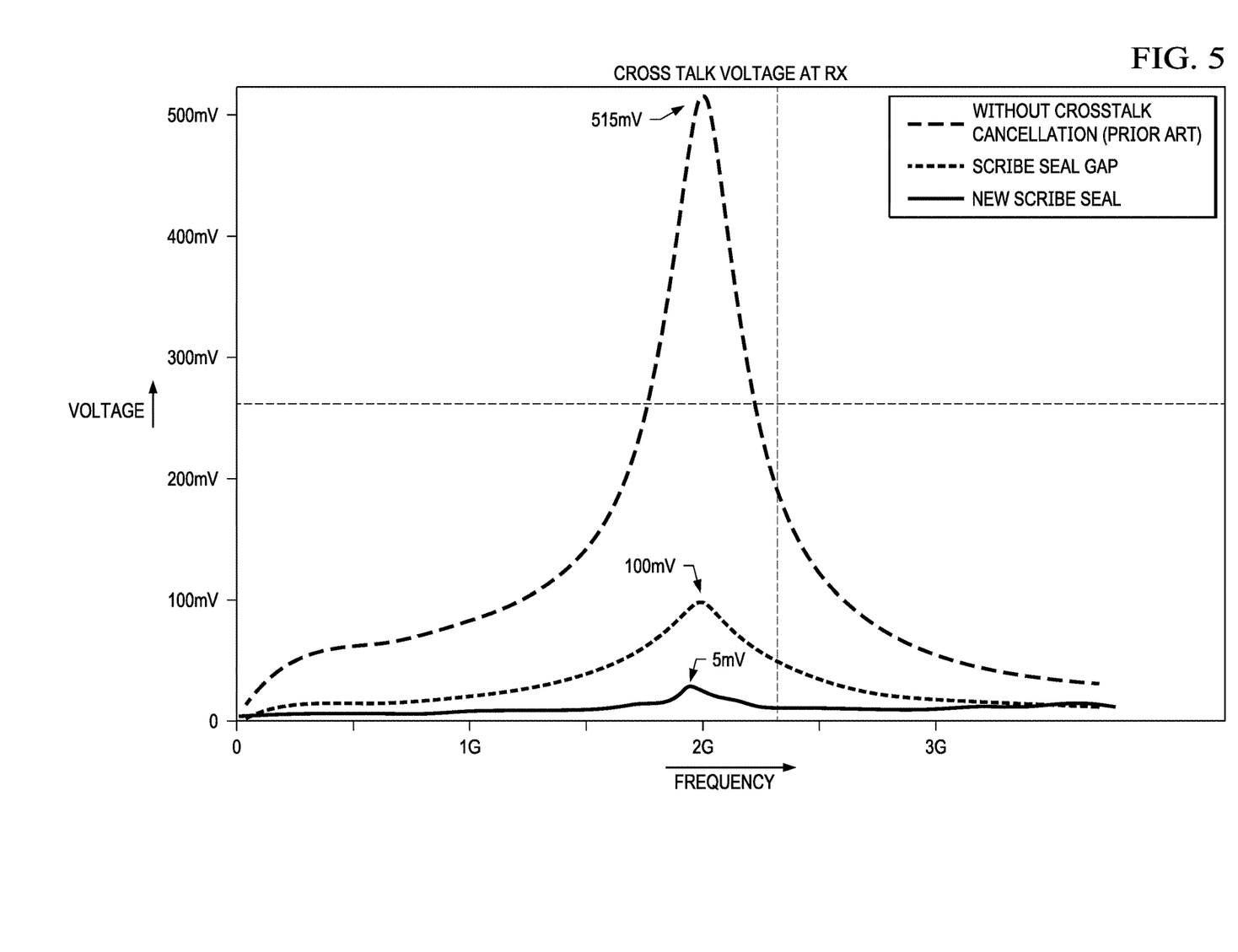
FIG. 5 is simulated data from a 4 channel digital isolator IC having a LC tank for each Rx and Tx circuit showing the crosstalk voltage received resulting from a transmission from a Tx circuit on the IC across the LC tank of a Rx circuit from a signal transmitted by a Tx circuit on the same die without any disclosed crosstalk cancellation being 515 mv, the crosstalk voltage received with a scribe seal having a scribe seal gap being 100 mv, and the crosstalk voltage received with a disclosed electrically split scribe seal shown in FIG. 2A that is electrically split into 2 scribe seal portions of only 5 mV, all across a frequency range shown including 1 GHz, 2 GHz and 3 GHz.

FIG. 5 is the simulated crosstalk voltage for a 4 channel digital isolator having an LC resonant network for each channel resulting from a circuit transmission across the LC tank of a Rx circuit from a signal transmitted by a Tx circuit on the same IC die for the cases of 1) without any crosstalk cancellation being 515 mv, 2) crosstalk voltage with a scribe seal having a seal gap of 100 mv, and 3) crosstalk voltage with a disclosed circumscribing scribe seal shown in FIG. 2A that is electrically split into 2 portions having a neck region of only 5 mv, across a frequency range shown including 1 GHz, 2 GHz and 3 GHz (shown as 1G, 2G and 3G). The test conditions were a 4V peak to peak (p2p) differential signal transmitted by the Tx circuit and the received signal at Rx circuit was an attenuated differential signal, where the Rx voltages were simulated across the LC Tank. This simulation predicted that crosstalk within an IC die due to the scribe seal loop and all other common loops (e.g., from other common metal structures) is almost completely eliminated by a disclosed electrically split scribe seal including a disclosed shorting structure that separately isolates at least some of the inductors on the IC die. Since the crosstalk voltage is not directly measurable on the completed MCM digital isolator, indirect measurements of signal integrity confirmed the effectiveness of the disclosed crosstalk cancellation.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. An integrated circuit (IC) die, comprising:
a substrate having a semiconductor surface layer including a plurality of metal levels thereon including a top and a bottom metal level with at least a first transmit (Tx) circuit and at least a first receive (Rx) circuit each having at least one isolation capacitor and an inductor;
a scribe seal around a periphery of the IC die including a first scribe seal portion around a periphery of the first Tx circuit and at least a second scribe seal portion around a periphery of the first Rx circuit, the scribe seal utilizing at least 2 of the plurality of metal levels including at least an outer metal stack;
wherein the first Tx circuit and the first Rx circuit are side-by-side along a first direction that defines a length dimension for the scribe seal, with a width dimension perpendicular to the length dimension, and wherein the outer metal stack includes at least one narrowed neck region that is between the first scribe seal portion and the second scribe seal portion;
wherein the neck region includes a shorting structure comprising at least one of the at least 2 of the plurality of metal levels for shorting together across the width dimension of at least a portion of the outer metal stack of the first and the second scribe seal portion.

2. The IC die of claim 1, further comprising an inner metal stack and a routing pass-through electrically isolated from the shorting structure and the inner metal stack including at least one other of the plurality of metal layers that provides a connection through the neck region between at least one node within the first scribe seal portion and at least one node within the second scribe seal portion.

3. The IC die of claim 2, wherein the plurality of metal levels include odd numbers metal levels alternating with even numbered metal levels, wherein the shorting structure includes one of the odd numbers metal levels and the even numbered metal levels, and wherein the routing pass-through includes another of the odd numbers metal levels and the even numbered metal levels.

4. The IC die of claim 2, wherein the inner metal stack and the outer metal stack both include at least one seal gap, wherein a doping level in the semiconductor surface layer at and around the seal gaps is reduced as compared to a doping level in the semiconductor surface layer away from the seal gaps.

5. The IC die of claim 2, wherein outside the neck region the inner metal stack and the outer metal stack both include each of the plurality of metal levels coupled together by vias, and wherein outside the neck region the bottom metal level is connected to the semiconductor surface layer.

6. The IC die of claim 1, wherein the at least a first Tx circuit comprises the first Tx circuit and a second Tx circuit, wherein the scribe seal further comprises:
a second narrowed neck region in the width dimension between the first Tx circuit and the second Tx circuit, wherein the second neck region further divides the first scribe seal portion into a first Tx scribe seal portion and a second Tx scribe seal portion, and
an additional shorting structure comprising at least one of the at least 2 of the plurality of metal levels that connects across the second neck region.

7. The IC die of claim 1, wherein the IC die includes at least one of a plurality of the Tx circuits and a plurality of the Rx circuits.

8. The IC die of claim 1, wherein the neck region has a width that is less than 25% of a maximum width of the scribe seal outside the neck region.

9. The IC die of claim 1, wherein the at least one isolation capacitor comprises a first isolation capacitor and a second isolation capacitor.

10. A digital isolator multi-chip module (MCM), comprising:
a first IC die on a first die pad and a second IC die on a second die pad separated from the first die pad;
the first IC die and the second IC die each comprising:
a substrate having a semiconductor surface layer including a plurality of metal levels thereon including a top metal level and a bottom metal level with at least a first transmit (Tx) circuit and at least a first receive (Rx) circuit each having at least one isolation capacitor and an inductor;
a scribe seal around a periphery of the IC die including a first scribe seal portion around a periphery the Tx circuit and a second scribe seal portion around a periphery the Rx circuit, the scribe seal utilizing at least 2 of the plurality of metal levels including at least an outer metal stack;
wherein the first Tx circuit and the first Rx circuit are side-by-side along a first direction that defines a length dimension for the scribe seal with a width dimension is perpendicular to the length dimension, and wherein the outer metal stack includes at least one narrowed neck region that is between the first scribe seal portion and the second scribe seal portion;
wherein the neck region includes a shorting structure comprising at least one of the at least 2 of the plurality of metal levels for shorting together across the width dimension of at least a portion of the outer metal stack of the first and the second scribe seal portion,
wherein the first IC die and the second IC die are coupled together by a first bond wire coupling the isolation capacitor associated with the first Tx circuit to the isolation capacitor associated with second Rx circuit to provide a first communications channel, and a second bond wire coupling the isolation capacitor associated with the first Rx circuit to the isolation capacitor associated with second Tx circuit to provide a second communications channel.

11. The digital isolator MCM of claim 10, further comprising an inner metal stack and a routing pass-through electrically isolated from the shorting structure and the inner metal stack including at least one other of the plurality of metal layers that provides a connection through the neck region between at least one node within the first scribe seal portion and at least one node within the second scribe seal portion.

12. The digital isolator MCM of claim 11, wherein the plurality of metal levels include odd numbers metal levels alternating with even numbered metal levels, wherein the shorting structure includes one of the odd numbers metal levels and the even numbered metal levels, and wherein the routing pass-through includes another of the odd numbers metal levels and the even numbered metal levels.

13. The digital isolator MCM of claim 11, wherein the inner metal stack and the outer metal stack both include at least one seal gap, wherein a doping level in the semiconductor surface layer at and around the seal gaps is reduced as compared to a doping level in the semiconductor surface layer away from the seal gaps.

14. The digital isolator MCM of claim 10, wherein the at least a first Tx circuit comprises the first Tx circuit and the second Tx circuit, wherein the scribe seal further comprises:
  a second narrowed neck region in the width dimension between the first Tx circuit and the second Tx circuit, wherein the second neck region further divides the first scribe seal portion into a first Tx scribe seal portion and a second Tx scribe seal portion, and
  an additional shorting structure comprising at least one of the at least 2 of the plurality of metal levels that connects across the second neck region.

15. The digital isolator MCM of claim 10, wherein the IC die includes at least one of a plurality of the Tx circuits and a plurality of the Rx circuits.

16. The digital isolator MCM of claim 10, wherein the neck region has a width that is less than 25% of a maximum width of the scribe seal outside the neck region.

* * * * *